US010454667B2

(12) United States Patent
Lee et al.

(10) Patent No.: US 10,454,667 B2
(45) Date of Patent: *Oct. 22, 2019

(54) PHASE CONTROL BLOCK FOR MANAGING MULTIPLE CLOCK DOMAINS IN SYSTEMS WITH FREQUENCY OFFSETS

(71) Applicant: Rambus Inc., Sunnyvale, CA (US)

(72) Inventors: Hae-Chang Lee, Los Altos, CA (US); Jared L. Zerbe, Woodside, CA (US); Carl William Werner, Los Gatos, CA (US)

(73) Assignee: RAMBUS INC., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/913,764

(22) Filed: Mar. 6, 2018

(65) Prior Publication Data
US 2018/0262323 A1    Sep. 13, 2018

Related U.S. Application Data

(63) Continuation of application No. 15/369,806, filed on Dec. 5, 2016, now Pat. No. 9,912,469, which is a
(Continued)

(51) Int. Cl.
*H04L 7/02* (2006.01)
*H04L 7/027* (2006.01)
(Continued)

(52) U.S. Cl.
CPC .......... *H04L 7/0278* (2013.01); *H03L 7/0814* (2013.01); *H03L 7/0816* (2013.01);
(Continued)

(58) Field of Classification Search
CPC ... H04L 7/0278; H04L 7/0008; H04L 7/0016; H04L 7/0079; H04L 7/0087; H04L 7/033;
(Continued)

(56) References Cited

U.S. PATENT DOCUMENTS 4,789,994 A    12/1988  Randall
5,056,054 A    10/1991  Wong et al.
(Continued)

FOREIGN PATENT DOCUMENTS

EP    0476487    3/1992
EP    1315328    5/2003
EP    1545045    6/2005

OTHER PUBLICATIONS

Aoyama et al., "3Gbps, 5000ppm Spread Spectrum SerDes PHY with Frequency Tracking Phase Interpolator for Serial ATA," NEC Electronics Corporation, 2003 Symposium on VLSI Circuits Digest of Technical Papers. 4 pages.
(Continued)

*Primary Examiner* — Kabir A Timory
(74) *Attorney, Agent, or Firm* — Morgan, Lewis & Bockius LLP

(57) ABSTRACT

A circuit for performing clock recovery according to a received digital signal. The circuit includes at least an edge sampler and a data sampler for sampling the digital signal, and a clock signal supply circuit. The clock signal supply circuit provides edge clock and data clock signals offset in phase from one another to the respective clock inputs of the edge sampler and the data sampler. A digital phase detector determines if the data clock is early, late or synchronized with respect to data value transitions in the digital signal, and based on that determination provides a phase adjustment signal to the clock signal supply circuit, which is operable to vary phases of the data and edge clock signals accordingly.

20 Claims, 3 Drawing Sheets

Related U.S. Application Data continuation of application No. 14/820,266, filed on Aug. 6, 2015, now Pat. No. 9,515,814, which is a continuation of application No. 14/321,723, filed on Jul. 1, 2014, now Pat. No. 9,106,399, which is a continuation of application No. 13/710,404, filed on Dec. 10, 2012, now Pat. No. 8,774,337, which is a continuation of application No. 12/225,999, filed as application No. PCT/US2007/008493 on Apr. 4, 2007, now Pat. No. 8,331,512.

(60) Provisional application No. 60/789,406, filed on Apr. 4, 2006.

(51) Int. Cl.
*H03L 7/081* (2006.01)
*H03L 7/091* (2006.01)
*H04L 7/033* (2006.01)
*H04L 7/00* (2006.01)

(52) U.S. Cl.
CPC .......... *H03L 7/0818* (2013.01); *H03L 7/091* (2013.01); *H04L 7/0008* (2013.01); *H04L 7/0016* (2013.01); *H04L 7/0079* (2013.01); *H04L 7/0087* (2013.01); *H04L 7/033* (2013.01); *H04L 7/0337* (2013.01); *H04L 7/0338* (2013.01); *H03L 2207/50* (2013.01)

(58) Field of Classification Search
CPC ... H04L 7/0337; H04L 7/0338; H03L 7/0814; H03L 7/0816; H03L 7/0818; H03L 7/0091
See application file for complete search history.

(56) References Cited

U.S. PATENT DOCUMENTS

| | | | |
|---|---|---|---|
| 5,293,405 | A | 3/1994 | Gersbach et al. |
| 5,384,551 | A | 1/1995 | Kennedy et al. |
| 5,703,853 | A | 12/1997 | Horigome et al. |
| 5,850,422 | A | 12/1998 | Chen |
| 5,896,391 | A | 4/1999 | Solheim et al. |
| 5,999,056 | A | 12/1999 | Fong |
| 6,038,266 | A | 3/2000 | Lee et al. |
| 6,282,690 | B1 | 8/2001 | McClellan et al. |
| 6,310,570 | B1 | 10/2001 | Rumreich et al. |
| 6,509,773 | B2 | 1/2003 | Buchwald et al. |
| 6,570,916 | B1 | 5/2003 | Feldbaumer et al. |
| 6,624,688 | B2 | 9/2003 | Jaussi et al. |
| 6,658,054 | B1 | 12/2003 | Kuribayashi et al. |
| 6,717,995 | B2 | 4/2004 | Zvonar |
| 6,734,920 | B2 | 5/2004 | Ghosh et al. |
| 6,771,725 | B2 | 8/2004 | Agazzi et al. |
| 6,791,388 | B2 | 9/2004 | Buchwald et al. |
| 6,931,088 | B1 * | 8/2005 | Tomita ............ H03L 7/08 375/376 |
| 6,968,480 | B1 | 11/2005 | Yuan et al. |
| 6,992,855 | B2 | 1/2006 | Ehrlich |
| 6,995,594 | B2 | 2/2006 | Buchwald et al. |
| 7,012,983 | B2 | 3/2006 | Buchwald et al. |
| 7,016,449 | B2 | 3/2006 | Buchwald et al. |
| 7,058,150 | B2 | 6/2006 | Buchwald et al. |
| 7,127,017 | B1 | 10/2006 | Evans et al. |
| 7,173,993 | B2 | 2/2007 | Engl et al. |
| 7,308,048 | B2 | 12/2007 | Wei |
| 7,315,596 | B2 | 1/2008 | Payne et al. |
| 7,325,175 | B2 | 1/2008 | Momtaz |
| 7,397,876 | B2 | 7/2008 | Cranford, Jr. et al. |
| 7,406,135 | B2 | 7/2008 | Cranford, Jr. et al. |
| 7,471,691 | B2 | 12/2008 | Black et al. |
| 7,508,871 | B2 | 3/2009 | Zerbe et al. |
| 7,508,872 | B2 | 3/2009 | Yamazaki |
| 7,587,012 | B2 | 9/2009 | Evans et al. |
| 7,639,736 | B2 | 12/2009 | Farjad-rad |
| 7,817,767 | B2 | 10/2010 | Tell et al. |
| 8,036,300 | B2 | 10/2011 | Evans et al. |
| 8,311,176 | B2 | 11/2012 | Lee et al. |
| 8,331,512 | B2 | 12/2012 | Lee et al. |
| 8,446,940 | B2 | 5/2013 | Farjad-rad |
| 2002/0044618 | A1 | 4/2002 | Buchwald et al. |
| 2003/0021371 | A1 | 1/2003 | He |
| 2003/0123572 | A1 | 7/2003 | Samueli et al. |
| 2004/0021246 | A1 | 2/2004 | Zikeli et al. |
| 2004/0061539 | A1 | 4/2004 | Joordens et al. |
| 2004/0158420 | A1 | 8/2004 | Kim et al. |
| 2005/0047500 | A1 | 3/2005 | Gupta et al. |
| 2005/0108600 | A1 | 5/2005 | Arguelles |
| 2005/0135471 | A1 | 6/2005 | Tonietto et al. |
| 2005/0135475 | A1 | 6/2005 | Momtaz et al. |
| 2005/0135510 | A1 | 6/2005 | Momtaz |
| 2005/0180536 | A1 | 8/2005 | Payne et al. |
| 2005/0271137 | A1 | 12/2005 | Kolze et al. |
| 2005/0271169 | A1 | 12/2005 | Momtaz et al. |
| 2006/0002497 | A1 | 1/2006 | Zhang |
| 2006/0034394 | A1 | 2/2006 | Popescu et al. |
| 2006/0062341 | A1 * | 3/2006 | Edmondson .......... H03L 7/0814 375/376 |
| 2006/0188043 | A1 | 8/2006 | Zerbe et al. |
| 2006/0233291 | A1 | 10/2006 | Garlepp et al. |
| 2006/0239389 | A1 | 10/2006 | Coumou |
| 2006/0251195 | A1 | 11/2006 | Chen et al. |
| 2006/0256892 | A1 | 11/2006 | Momtaz |
| 2006/0280240 | A1 | 12/2006 | Kikugawa et al. |
| 2007/0002942 | A1 | 1/2007 | Simpson et al. |
| 2007/0110199 | A1 | 5/2007 | Momtaz et al. |
| 2007/0195874 | A1 | 8/2007 | Aziz et al. |
| 2007/0253475 | A1 | 11/2007 | Palmer |
| 2008/0285695 | A1 | 11/2008 | Cranford, Jr. et al. |
| 2009/0076939 | A1 | 3/2009 | Berg et al. |
| 2009/0237138 | A1 | 9/2009 | Shanbhag et al. |

OTHER PUBLICATIONS

Casas et al., "DFE Tutorial," Jul. 14, 1998, Slides 1-29. 15 pages.
Chang et al., "A 0.4-4GB/s CMOS Quad Transceiver Cell Using On-Chip Regulated Dual-Loop PLLs," IEEE Journal of Solid State Circuits, vol. 38, No. 5, May 2003. 8 pages.
CN First Office Action dated Apr. 1, 2012 re CN Application No. 200780049526.7. 11 pages.
EP Examination Report dated Feb. 28, 2013 in EP Application No. 07853389.0. 7 pages.
EP Office Communication dated Aug. 23, 2010 in EP Application No. 07853389.0. 5 pages.
EP Office Communication dated Nov. 8, 2011 in EP Application No. 07853389.0. 7 pages.
EP Response dated Dec. 29, 2010 in EP Application No. 07853389.0. 38 pages.
EP Response dated Jun. 24, 2013 in EP Application No. 07853389.0, Includes New Claims (Clear and Highlighted copies) and New Description pp. 3, 20, 21, and 23. 16 pages.
EP Response dated May 15, 2012 re EP Application No. 07853389.0, Includes New Claims (Highlighted and Clear copies). 15 pages.
Farjad-Rad et al., "0.622-8 Gbps 150mW Serial IO Macrocell with Fully Flexible Preemphasis and Equalization," Symposium on VLSI Circuits Digest of Technical Papers, Jun. 2003. 4 pages.
Harwood et al., "24.1: A 12.5Gb/s SerDes in 65nm CMOS Using a Baud-Rate ADC with Digital Receiver Equalization and Clock Recovery," Feb. 14, 2007, 2007 IEEE International Solid-State Circuits Conference, pp. 436-437, 613, 24.1.1-24.1.7. 10 pages.
Harwood et al., "A 12.5Gb/s SerDes in 65nm CMOS Using a Baud Rate ADC with Digital RX Equalization and Clock Recovery," Slideshow Presentation, 2007 IEEE International Solid-State Circuits Conference. 18 pages.
Lee et al., "A Second-Order Semi-Digital Clock Recovery Circuit Based on Injection Locking," ISSCC 2003 Session 4, Clock Recovery and Backplane Transceivers Paper 4.3. 8 pages.
Lee et al., "Burst Mode Packet Receiver Using a Second Order DLL," 2004 Symposium on VLSI Circuits Digest of Technical Papers. 4 pages.

(56) References Cited

OTHER PUBLICATIONS

Lee et al., "Paper 18.4: Improving CDR Performance via Estimation," 2006 IEEE International Solid-State Circuits Conference, Feb. 7, 2006. 8 pages.
Meghelli et al., "4.1: A 10Gb/s 5-Tap-DFE/4-Tap-FFE Transceiver in 90nm CMOS," Feb. 6, 2006, 2006 IEEE International Solid-State Circuits Conference. 10 pages.
Napier, Tom, "Flash ADC Takes the Uncertainty Out of High-Speed Data Recovery," EDN Design Feature, Sep. 7, 1998, pp. 111-118. 5 pages.
PCT International Preliminary Report on Patentability (Chapter II) dated Mar. 21, 2011 in International Application No. PCT/US07/25634. 6 pages.
PCT International Search Report and Written Opinion dated Apr. 15, 2008 in International Application No. PCT/US2007/025634. 12 pages.
Sidiropoulos et al., "A Semidigital Dual Delay-Locked Loop," IEEE Journal of Solid-State Circuits, vol. 32, No. 11, Nov. 1997, pp. 1683-1692. 10 pages.
Stojanovic et al., "Modeling and Analysis of High-Speed Links," Research Supported by the MARCO Interconnect Focus Center and Rambus, Inc., Sep. 21, 2003. 8 pages.
Zerbe et al., "Comparison of Adaptive and Non-Adaptive Equalization Methods in High-Performance Backplanes," dated 2005, DegignCon 2005. 17 pages.
Zerbe et al., "Equalization and Clock Recovery for a 2.5-10-Gb/s 2-PAM/4-PAM Backplane Transceiver Cell," IEEE Journal of Solid-State Circuits, vol. 38, No. 12, Dec. 2003. 10 pages.

\* cited by examiner

PHASE CONTROL BLOCK FOR MANAGING MULTIPLE CLOCK DOMAINS IN SYSTEMS WITH FREQUENCY OFFSETS

CROSS-REFERENCE TO RELATED APPLICATIONS

This application is a continuation of U.S. application Ser. No. 15/369,806, filed Dec. 5, 2016, now U.S. Pat. No. 9,912,469, which is continuation of U.S. application Ser. No. 14/820,266, filed Aug. 6, 2015, now U.S. Pat. No. 9,515,814, which is continuation of U.S. application Ser. No. 14/321,723, filed Jul. 1, 2014, now U.S. Pat. No. 9,106,399, which is a continuation of U.S. application Ser. No. 13/710,404, filed Dec. 10, 2012, now U.S. Pat. No. 8,774,337, which is a continuation of U.S. patent application Ser. No. 12/225,999, filed Jan. 12, 2009, now U.S. Pat. No. 8,331,512, which is a United States National stage application filed under 35 U.S.C. § 371 of PCT Patent Application Serial No. PCT/US2007/008493, filed Apr. 4, 2007, which claims the benefit of the filing date of U.S. Provisional Patent Application No. 60/789,406 filed Apr. 4, 2006, all of which are incorporated herein by reference in their entireties.

BACKGROUND

The present invention relates to clock recovery circuits and related circuits used for receiving and transmitting digital signals.

Modern digital systems typically include multiple digital devices capable of communicating with each other using digital signals made of sequences of digital symbols. A digital symbol takes up a time interval, which is often referred to as a unit interval or a data interval. A digital device may transmit a digital data signal by setting the value of a signal parameter associated with a communication channel to one of a plurality of predetermined values for each data interval according to a transmitter clock. A digital device that receives the digital signal takes successive samples of the signal according to a recovered clock and determines the values of the signal parameter represented by the samples. The recovered clock is preferably synchronized with the digital signal so that the samples are taken at times corresponding to the data intervals.

To communicate data at high speed, it is desirable to make the data intervals as short as possible, which, in turn, requires greater precision in the synchronization between the recovered clock used by the receiving device and the data intervals of the incoming signal. For example, modern interfacing and communication protocols such as PCI Express, SONET, InfiniBand and XAUI use data intervals on the order of nanoseconds or less, and require that the receiving device use a clock which is synchronized to the data intervals to within a fraction of one data interval.

In a typical link between two digital devices a receiving device employs two clock domains to sample a received digital signal. The two clock domains employed are the edge clock domain and the data clock domain. The edge clock domain is used to sample the digital signal at or near the boundaries of the data intervals. The data clock domain is used to sample the digital signal at a point between the boundaries of the data intervals so as to minimize the effect that signal transitions may have on the data domain samples.

The edge and data domain samples of the digital signal are used to synchronize the recovered clock to the transmitter clock. More specifically, the edge and data domain samples are supplied to a phase detector within the receiver which, in turn, uses the edge and data domain samples to generate a phase error signal indicative of the relative phase error between the transmitter clock and the recovered clock. The phase error signal is passed to a phase controller within the receiver, and the phase controller adjusts the phase of the edge and data clocks in accordance with the phase error signal. Thus, the phase detector and phase controller are part of a feedback loop that serves to minimize the phase error signal.

BRIEF DESCRIPTIONS OF THE DRAWINGS

The following detailed description given by way of example, but not intended to limit the invention solely to the specific embodiments described, may best be understood in conjunction with the accompanying drawings wherein like reference numerals denote like elements and parts, in which.

DETAILED DESCRIPTION

It has been recognized that it is desirable to allow for a selectively variable phase offset between clock domains. Further, it has been recognized that it is desirable for digital receivers to employ three or more clock domains, and that there is a need for systems and methods to synchronize such multiple clock domains with a transmitter clock. Still further, it has been recognized that it is desirable to provide for selectively variable phase offset and/or the synchronization of three or more clock domains.

For purposes of clarity of presentation, the preferred embodiments will be discussed in the context of second order clock recovery. Upon review of this disclosure, one skilled in the art will readily appreciate how the present system and method is applied in the context of first order clock recovery and higher order clock recovery.

Figure 1:
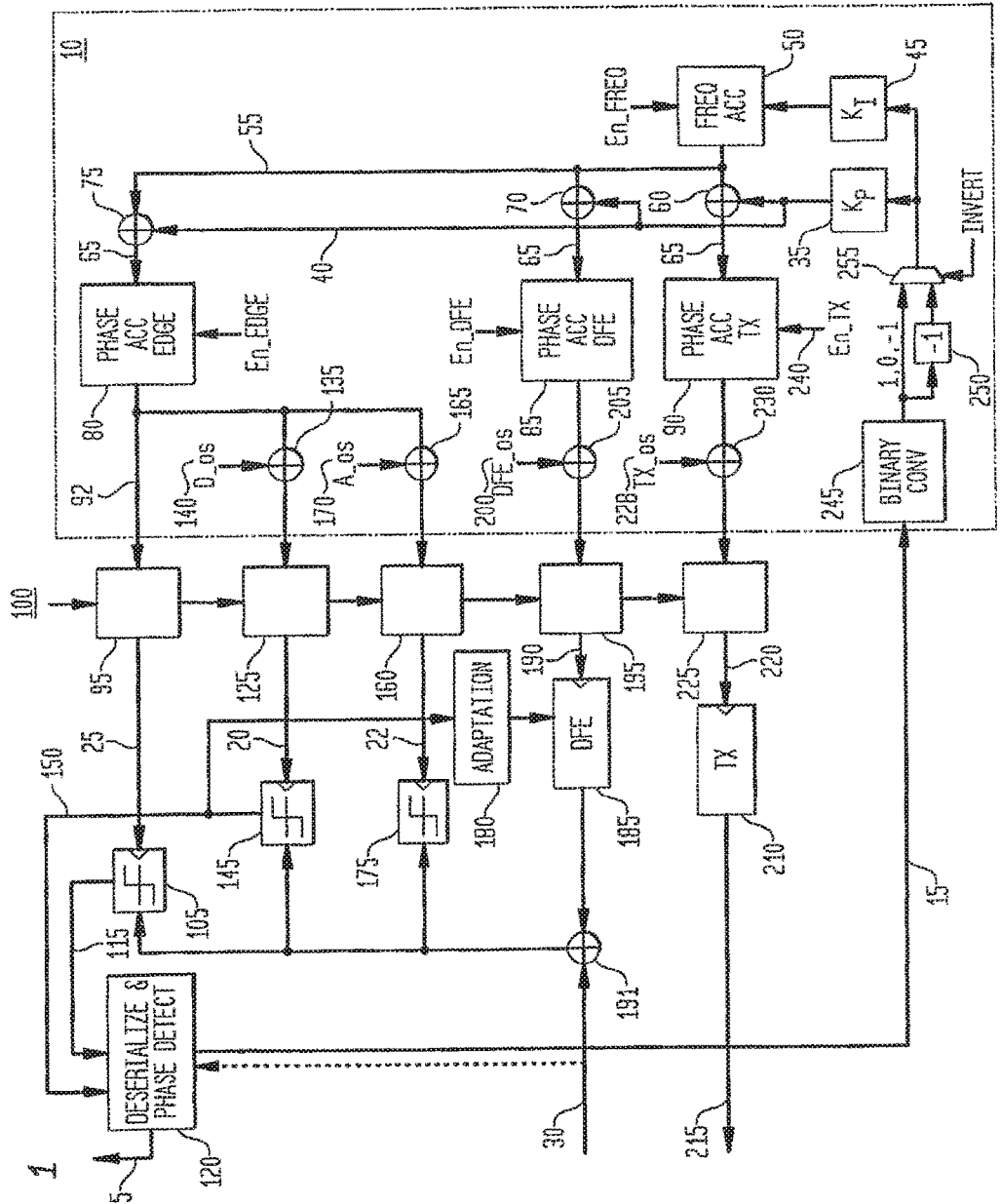
FIG. 1 is a block diagram of a clock and data recovery circuit in accordance with a preferred embodiment.

A circuit according to one embodiment is shown in FIG. 1. The circuit of FIG. 1 includes a feedback circuit 10 arranged to receive a phase error signal 15 indicating a relative phase relationship between an incoming digital signal 30 and a data clock signal 20 and/or edge clock signal 25. The phase error signal is supplied to a first proportionality constant unit 35 ("Kp") which multiplies the phase error signal by a proportionality constant to provide a first signal component 40 directly related to the phase error. The phase error signal is also supplied to a second proportionality constant unit 45 ("Ki") which multiplies the phase error signal by a second proportionality constant and supplies the resulting signal to an accumulator 50 ("Freq. ACC") which in turn provides an output or second signal component 55. When the system is in lock with a digital signal 30, this output represents the frequency offset between the Receiver clocks and the digital signal 30. An adder 60 combines the first and second signal components to provide a phase adjustment signal 65 which includes both of these components. The phase adjustment signal may be positive or negative depending on the sign of the phase error and its integral. Although FIG. 1 depicts three identical adders 60, 70, and 75, providing three identical phase adjustment signals, a single adder may be used. The feedback circuit is a "second order" circuit.

The phase adjustment signal is supplied to three accumulating registers 80, 85, and 90 ("Phase ACC Edge," "Phase ACC DFE," and "Phase ACC TX"). Each register maintains a phase shift value and increments or decrements the phase shift value in response to the phase adjustment signal.

One register ("Phase ACC Edge") is connected directly to a control input 92 of an edge clock phase shifter 95 ("Interpolator Edge") which in this embodiment is a phase interpolator. Other types of phase shifters may be used in place of each interpolator referred to herein as, for example, adjustable delay lines or combinations of delay lines and phase interpolators. The edge clock phase shifter is arranged to receive a clock signal 100 referred to herein as the "Receiver clock signal." The Receiver clock signal may be generated by a phase locked loop (not shown) or other conventional circuit and in many embodiments will be multiple clock signals of the same frequency but equally spaced within a period of the Receiver clock signal. The edge clock phase shifter shifts the phase of the Receiver clock signal by an amount directly related to the output of Phase ACC Edge. The phase-shifted replica of the Receiver clock signal constitutes the edge clock signal. The edge clock signal is applied to the clock input of a latch or other sampling device 105 ("Edge Sampler"). This sampling device receives a digital signal 110 ("equalized signal"), captures successive samples of the digital signal at times set by the edge clock signal and compares these samples to a threshold to convert each sample to "edge samples" 115, which are in the form of a digital "1" or "0." These "edge samples" are supplied to a deserializer and phase detector 120.

A data phase shifter 125 ("Interpolator Data") has a control input 130 connected to an adder 135 which receives the phase shift value from the same register ("Phase ACC Edge") and which also receives a data clock offset value 140 ("D_os") which in this embodiment is selectable by an input applied to the circuit. For example, D_os may be a value held in a user-programmable register or a value supplied by another circuit. Thus, the value supplied to the control input of the data phase shifter will be the sum of the phase shift value stored in register Phase ACC Edge and the data clock offset value. The data phase shifter also receives the Receiver clock signal and produces a replica of this signal (the "data clock" signal 20) phase-shifted by an amount directly related to this sum. Thus, the phase offset between the edge clock signal and the data clock signal is selectively variable by varying D_os. The data clock signal is applied to a data sampler 145 which functions in the same way as the edge sampler discussed above to sample the digital signal ("equalized signal") provide a series of 1 and 0 values 150 ("data samples") to the deserializer and phase detector. The deserializer and phase detector provides data samples 155 as parallel data bytes and also determines from the values of the data and edge samples whether the data clock and edge clock are early or late relative the timing of the digital signal. The deserializer and phase detector thus provides the phase error signal in the form of a signal indicating whether the data and edge clocks are early or late relative to the digital signal. In this embodiment, the phase detector is integrated with the deserializer. One form of such a phase detector is shown in FIG. 2.

Figure 2:
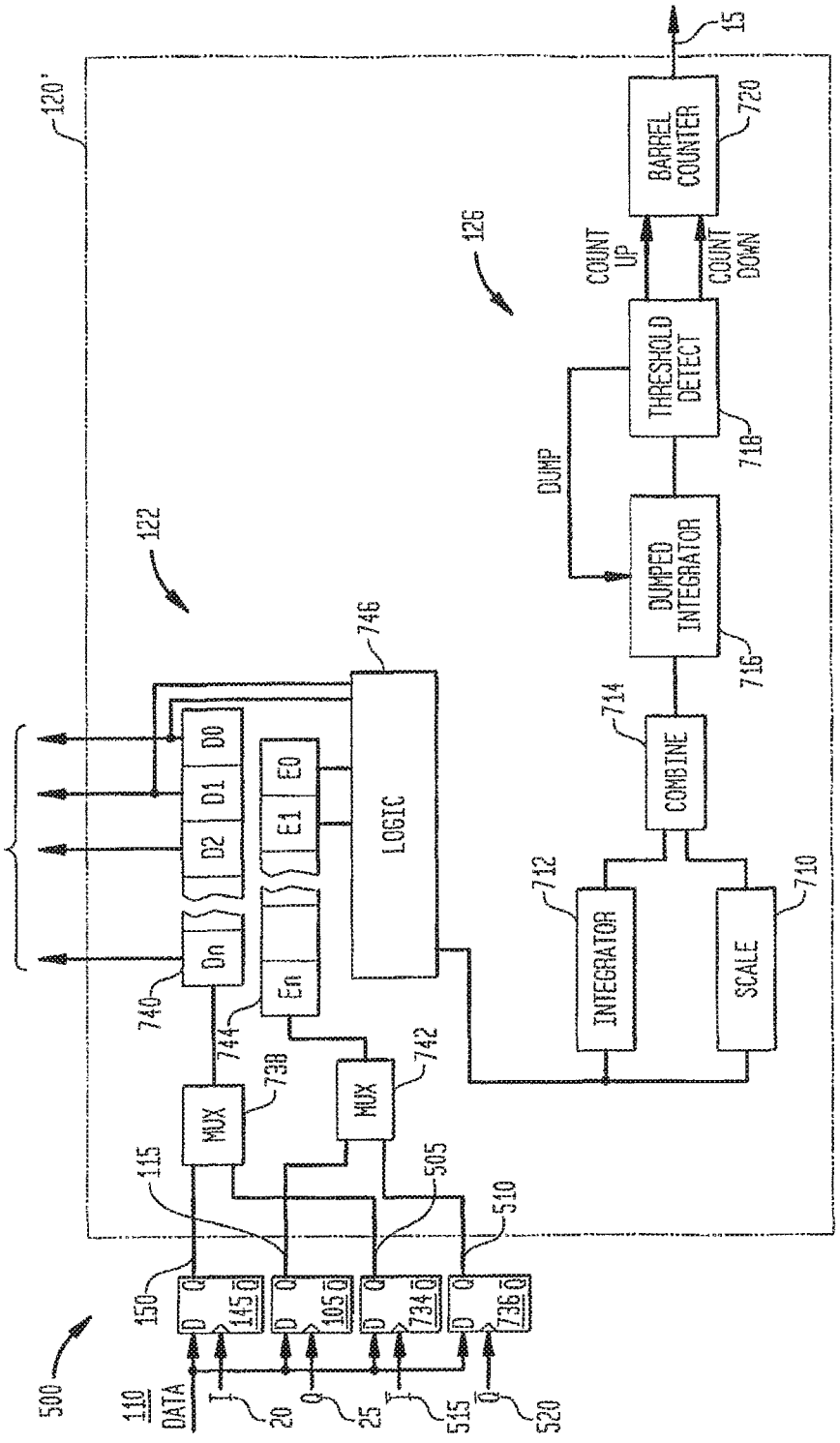
FIG. 2 is a block diagram of a phase detector in accordance with a preferred embodiment.

FIG. 2 shows a preferred embodiment of deserializer and phase detector 120' along with associated data sampling circuitry 500. The deserializing portion of the deserializer and phase detector is indicated generally as element 122. The phased detecting portion of the deserializer and phase detector is indicated generally as element 126.

It should be noted that deserializer and phase detector 120' may have two more inputs than deserializer and phase detector 120 of FIG. 1, delayed data samples 505 and delayed edge samples 510. Thus, the data sampling circuitry of FIG. 2 includes data sampler 734 and edge sampler 736 for delayed sampling of the equalized signal.

It should be further noted that delayed sampling is well known in the art, and that upon review of this disclosure one skilled in the art will readily understand how the invention is implemented in the context of delayed sampling and the deserializer and phase detector of FIG. 2.

In any event, samplers 145, 105, 734, and 736 are in the form of latches. The samplers are respectively clocked by data clock 20, edge clock 25, a delayed data clock 515, and a delayed edge clock 520. The delayed data clock has the same frequency as the data clock but is delayed in phase by 180 degrees relative to the data clock. Similarly, the delayed edge clock has the same frequency as the edge clock but is delayed in phase by 180 degrees relative to the edge clock. Each of the data clock, edge clock, delayed data clock, and delayed edge clock has a period equal to two data intervals.

Figure 3A:
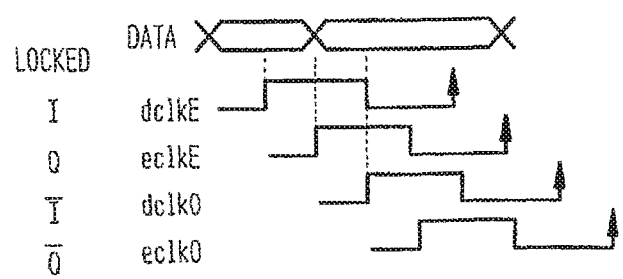
FIGS. 3A-3D are timing diagrams useful for understanding the operation of the phase detector shown in FIG. 2.
Figure 3B:
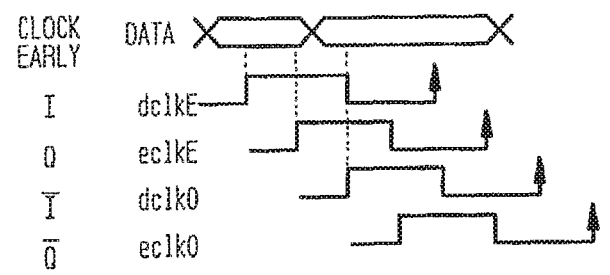
Figure 3C:
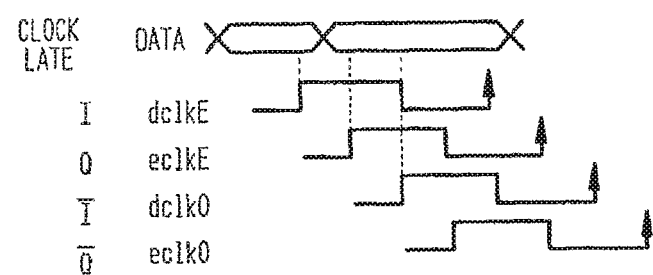
Figure 3D:
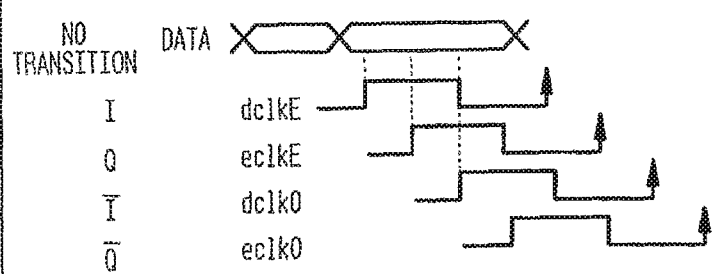

In the ideal locked condition shown in FIG. 3A, the data clock and delayed data clocks are aligned in the centers of successive data intervals, whereas the edge clock and delayed edge clock are aligned with the boundary or edges between successive data intervals. The serial data input is connected to latch 145, clocked by clocked by the data clock; to latch 105, clocked by the edge clock; to latch 734 clocked by the delayed data clock; and to latch 736, clocked by the delayed edge clock. Accordingly, in the locked condition shown in FIG. 13A, latches 145 and 734 will sample the serial data signal in alternate data intervals, referred to herein as "even" and "odd" data intervals, whereas latches 105 and 736 will sample the serial data signal at alternate even and odd boundaries between data intervals. Thus, the data clock and delayed data clock can be referred to as even and odd data clocks, whereas the edge clock and delayed edge clock can be referred to as even and odd edge clocks.

In this manner, the samplers output data samples 150, edge samples 115, delayed data samples 505, and delayed edge samples 510. The samples output from the samplers are passed to deserializer and phase detector 120'. The deserializer and phase detector 120' includes a digital phase detector 122 and a digital loop filter 126.

The outputs of latches 145 and 734, clocked by the data clocks, are connected through a multiplexer 738 to the input of a shift register 740, referred to herein as the data register. Thus, as the latches and multiplexer operate, 1 or 0 values from latches 145 and 734, representing samples taken during successive even and odd data intervals, will be clocked into register 740. The outputs of latches 105 and 736, clocked by the edge clocks, are connected through another multiplexer 742 to a shift register 744, referred to herein as the edge register. Each shift register is arranged to hold n bits, where n is equal to the number of bits in a byte of parallel data. Thus, after n data intervals, data register 740 will hold data as shown in FIG. 2, with an even bit D0 representing the sample taken during a first, even data interval in the first position, an odd bit D1 representing the sample D1 taken during the next, odd data interval, and so on. Similarly, the first position in edge register 744 will hold a first, even bit E0 representing the sample taken at the boundary between the first and second data intervals, i.e., at the boundary between the data intervals represented by bits D0 and D1. Likewise, the second position in edge register 744 will hold an odd bit E1 representing the sample taken at the boundary between the data intervals represented by bits D1 and D2, and so on.

Data register 740 is arranged to supply all of the bits together, as the parallel data output of the deserializer. The data and edge registers 740 and 744 also are connected to a logic circuit 746. Logic circuit 746 is arranged to perform an exclusive or (XOR) operation between each data bit in data register 740 and the next succeeding bit in the data register to derive a transition detect signal. The logic circuit 746 is also arranged to perform an XOR operation between each data bit in data register 740 and the corresponding edge bit in register 744 to provide an early/late signal. For example, the XOR of D0 and D1 provides a transition detect signal associated with D0, whereas the XOR of D0 and E0 provides an early/late signal associated with D0. Logic circuit 746 is arranged to provide a count value for each byte equal to the number of early/late signals for that byte having value 1 minus the number of early/late signals which have value 0. However, the logic circuit is arranged to exclude from the count the early/late signal associated with each data bit if the transition detect signal associated with that data bit is 0. A positive number indicates that the clock is late relative to the data signal, whereas a negative number indicates that the clock is early relative to the data signal.

The operation of the digital phase detector of FIG. 2 can be better understood with reference to FIGS. 3A-3D. In a perfectly locked condition (FIG. 3A), each edge sample represented by the bits in the edge register is taken precisely at the boundary between data intervals. The voltage used to represent digital 1 or 0 has an indeterminate value, somewhere between the high value representing 1 and the low value representing 0. Thus, when latch 105 or latch 736 samples the signal, the probability the digital value output by the latch will be 1 is equal to the probability that the value will be 0. Therefore, the number of 0 early/late signals generated by the logic circuit will be equal to the number of 1 early/late signals.

Where the clock is early (FIG. 3B), each edge bit represents a sample taken during the immediately preceding data interval, rather than at the boundary or edge between data intervals. Therefore, each edge bit in register 744 will have the same value as the corresponding data bit in register 740, and hence each early/late signal will be 0. Where the clock is late (FIG. 3C), each edge bit represents a sample taken during the immediately succeeding data interval, rather than at the boundary between data intervals. If there is a transition in the data between these intervals, the edge bit will have a value different from the corresponding data bit, and the early/late signal will be 1.

If there is no transition between two successive data intervals, so that the data bits are the same, the edge bit will have the same value as the data bits regardless of whether the clock is early or late, and the early/late signal will be 0. However, in this case, the transition signal will also be 0 and the early/late signal is ignored.

The count from logic circuit 746 is supplied to a scaling factor unit which supplies a value equal to the value from register 718 multiplied by a scaling factor, and to an integrator 712 which integrates the value supplied by register 708 over time and applies an appropriate scaling factor. The output of integrator 712 and scaling factor unit 710 are periodically sampled by a combining circuit 714. The combined value from unit 714, thus, represents a combination of a first-order signal from scaling unit 710 representing substantially instantaneous clock signal lead or lag, and a second-order component from integrator 712 representing the integral of the lead or lag over time. Combining unit 714 supplies each such combined value to a dumped integrator 716 linked to a threshold detection unit 718, which, in turn, is linked to a barrel counter 720. Integrator 716 accumulates a total representing all of the signals from combining unit 714. If the total reaches a positive threshold, threshold detection unit 718 issues a count-up signal to barrel counter 720 and a dump signal to integrator 716, which resets the integrator to 0. If the total reaches a negative threshold, the threshold detection unit 718 issues a count-down signal to barrel counter 720 and also resets the integrator 716 to 0. Counter 720 holds a count value; it increments the count by a preselected increment for each count-up signal and decrements the count by the same increment for each count-down signal. Counter 720 counts along a circular scale corresponding to 360 degrees. Thus, assuming that the barrel counter is operating with a 1 degree increment and the current count is 359 degrees, the count will be reset to 0 if a count-up signal is received. Similarly, if the count is currently 0 degrees, the count will be reset to 359 degrees if a count-down signal is received. The output of the barrel counter constitutes the digital control signal.

The particular implementation shown in FIG. 2 can be varied. For example, combiner 714 can be replaced by a multiplexer which can be actuated to select either the second order signal from integrator 712 or the first order signal from scale factor 710, so as to provide only a first-order characteristic or only a second-order characteristic. Also, the scale factor unit 710 may be omitted entirely if only a second-order characteristic is desired, and integrator 712 may be omitted if only a first-order characteristic is desired. The components of the digital phase detector may be replaced by other circuits which perform the equivalent operation of edge detecting the data signal and multiplying the clock signal by the edge detection signal. See "Monolithic Phase-Locked. Loops And Clock Recovery Circuits—Theory And Design," Razavi, ed., February 1996, pp. 33-35. The digital loop filter will retain a fixed value for the digital control signal, even during a prolonged absence of transitions in the data signal.

Other types of phase detectors can be used as well. In any case, the data and edge clocks thus operate in conjunction with one another on the received signal. The term "recovered clock" refers to either or both of these clock signals.

The ability to vary the offset between the data clock and edge clock can be used, for example, to minimize the bit error rate where the digital signal has an asymmetric data eye.

An adaptive clock phase shifter 160 ("Interpolator Adapt") is connected to an adder 165 which receives the phase shift value from the same register ("Phase ACC Edge") and also receives a selectively variable adaptive clock offset value 170 ("A_os"). The adaptive clock phase shifter provides another replica ("adaptive clock") 22 of the Receiver clock, phase shifted by an amount directly related to the sum of the phase shift value stored in register Phase ACC Edge and A_os, to a further sampler 175 which also samples the equalized signal. The selectively variable offset between the adaptive clock and the data and edge clocks allows control of the adaptive sampler to take samples at any desired point on the digital signal waveform. This capability can be used to measure the size of the data eye of the digital signal while the system continues to collect the data using the data clock and edge clock as discussed above. Furthermore, the values provided by the adaptive sampler are provided to a circuit 180 ("adaptation") which may also receive the values from the data sampler. The "adaptation"

block can use these sampler outputs to optimize the equalizers "DFE" to obtain a better BER performance through the link. That the process of adapting an equalizer requires these samples is obvious to those skilled in the art.

In the embodiment discussed above, the edge phase shifter ("Interpolator Edge") is connected directly to the register (Phase ACC Edge"), whereas the data and adaptive phase shifters are connected to the register via the adders. The reverse arrangement, with the data phase shifter directly connected and the edge clock connected to an adder for adding a selectively variable offset, can be used.

A decision feedback equalization or "DFE" circuit output 185 is connected to a summing node 191 which accepts the received digital signal 30. The DFE circuit supplies a signal which depends on the values of the immediately preceding bits in the received signal, i.e., on the data values derived during immediately preceding bit intervals, so as to produce the equalized signal discussed above. The DFE circuit compensates for inter-symbol interference. DFE circuits per se are known and are not further described herein. However, in FIG. 1, the timing of the DFE circuit is controlled by a DFE clock 190 which is provided by a DFE phase shifter 195 ("Interpolator DFE"). The DFE phase shifter provides a further replica of the Receiver clock signal, phase shifted by an amount which is controlled by the sum of the phase shift value in register Phase ACC DFE and a selectively variable offset 200 (DFE_os). The sum of the phase shift value in register Phase ACC DFE and the selectively variable offset 200 is formed by an adder 205. The ability to vary the offset allows optimization of the timing of the DFE circuit.

A transmitter 210 ("TX") transmits data values 215 supplied to the transmitter using a clock signal 220 ("Transmit Clock"). The transmit clock signal is derived by a further phase shifter 225 ("interpolator TX") as a replica of the Receiver clock signal phase shifted by the sum of a selectively variable offset 230 ("TX_os") and a phase shift value stored in register Phase ACC TX. The sum of selectively variable offset 230 and the phase shift value stored in register Phase ACC TX is formed by an adder 235.

While in normal operation the Phase ACC TX is disabled so that the Transmit Clock is stationary, it is advantageous for link diagnostic purposes for it to track the movement of the recovered clock with a fixed phase offset. For instance, by setting the transmit data to be a series of alternating 1's and 0's while enabling the Phase ACC TX, the transmitted signal becomes a clock signal which has a fixed phase relationship to the edge clock. This allows a method by which the variations on the phase of the recovered clock can be observed without requiring separate pins or probing even in the presence of frequency offsets. During normal use of the chip, the transmitted signal is used to convey real data while the register Phase ACC TX is disabled by a signal 240 ("En_TX"). Similarly, the linkage between the DFE signal and the other clocks can be enabled or disabled.

Components 245, 250, and 255 of FIG. 1, respectively marked "Binary Cony," "−1" and "Invert," can be selectively actuated to lock the phase error signal at zero or to invert the phase error signal.

In a variant of the embodiment discussed above, one or both of the DFE clock and transmit clock can be derived from the phase shift value stored in the same register used for the other clock signals ("Phase ACC Edge"). In a further variant, some of the features discussed above can be omitted. For example, the system can be used without the transmitter and transmit clock, or without the adaptive clock. In another example, the relationship between the data clock and edge clock can be fixed. In a further variant, the offset values can be derived automatically during operation. In yet another variant, the feedback circuit may be a first-order or higher-order circuit.

The particular embodiments shown above are merely illustrative. For example, the circuitry discussed above can be implemented in any desired form as, for example, as TTL or CMOS circuitry. The invention can be applied to data signals other than electrical signals as, for example, optical data signals. Also, the invention can be applied to data signals other than binary signals as, for example, in multi-level signaling, also referred to as pulse amplitude modulation signaling. For example, in a PAM 3 signal, the value or characteristic of the data signal may have any one of three values during each data interval. In the embodiments discussed above, the data signal is a signal sent by a sending device outside of the monolithic integrated circuit which incorporates the clock recovery circuit. However, the same clock recovery circuit can be employed where the data signal is sent from another portion of the same monolithic integrated circuit.

As these and other variations and combinations of the features discussed above can be utilized without departing from the present invention as defined by the claims, the foregoing description of the one embodiments should be taken by way of illustration rather than by way of limitation of the invention as defined by the claims.

The invention claimed is:

1. A circuit for receiving a digital signal comprising:
   a data sampler and an edge sampler for sampling the digital signal, each sampler having a clock input;
   a clock signal supply circuit for providing a first clock signal having a first phase to the data sampler clock input and a second clock signal having a second phase to the edge sampler clock input, wherein the first and second phases are offset with respect to each other;
   temporary storage for receiving a first plurality of samples of the digital signal sampled by the data sampler and a second plurality of samples of the digital signal sampled by the edge sampler; and
   a digital phase detector, coupled to receive outputs of the temporary storage, for:
      receiving, under control of the first clock signal, the first plurality of samples of the digital signal and, under control of the second clock signal, the second plurality of samples of the digital signal; and
      providing a sequence of phase correction values using the received first plurality of samples of the digital signal and the received second plurality of samples of the digital signal;
   wherein the clock signal supply circuit is operative to selectively vary the first and second phases based on the sequence of phase correction values.

2. The circuit of claim 1, wherein the digital phase detector includes:
   a first circuit portion that generates a sequence of values that indicate, at a sequence of times, whether the first clock signal is early, late or synchronized with data value transitions in the digital signal, wherein the sequence of values includes, over time, a first value corresponding to the first clock being early relative to data transitions in the data signal, a second value corresponding to the first clock being late relative to data transitions in the data signal, and a third value corresponding to the first clock being synchronized with data transitions in the data signal; and
   a second circuit portion, comprising a digital loop filter, for:

integrating the sequence of values to produce an integrated value and scaling the integrated value to produce a sequence of combined values; and providing the sequence of phase correction values based on the sequence of combined values.

3. The circuit of claim 2, wherein the first circuit portion includes a logic circuit for comparing data samples obtained from the data sampler using the first clock signal and edge samples obtained from the edge sample using the second clock signal to produce the sequence of values.

4. The circuit of claim 3, wherein the logic circuit is configured to generate a value, comprising an early/late value, in the sequence of values by:
determining whether a transition between first and second samples of the first plurality of samples is detected,
comparing a timing between corresponding first samples of the first and second pluralities of samples; and
providing the early/late value based on a result of said determining whether a transition between the first and second samples of the first plurality of samples is detected, and based on a result of the timing comparison between the corresponding first samples of the first and second pluralities of samples.

5. The circuit of claim 4, wherein the digital phase detector is configured to:
use a result of the timing comparison between the corresponding first samples of the first and second pluralities of samples to update an early/late value in the sequence of early/late values if a transition is detected between the first and second samples of the first plurality of samples; and
ignore a result of the timing comparison between the corresponding first samples of the first and second plurality of samples if a transition is not detected between the first and second samples of the first plurality of samples.

6. The circuit of claim 5, wherein using a result of the timing comparison between respective first samples of the first and second pluralities of samples to update the early/late value comprises:
in accordance with a determination that the corresponding first samples of the first and second plurality of samples represent different logic values, performing one of an incrementing or a decrementing of the early/late value; and
in accordance with a determination that the corresponding first samples of the first and second plurality of samples represent the same logic value, performing the other of an incrementing or a decrementing of the early/late value.

7. The circuit of claim 2, wherein the second portion of the digital phase detector includes a threshold detection circuit for comparing at least one of a first-order component of a respective phase correction value, in the sequence of phase correction values, representing substantially instantaneous clock signal lead or lag and a second-order component of the phase correction value representing an integral of a clock lead or lag over time with a threshold, and adjusting the respective phase correction value in accordance with a result of the comparison.

8. The circuit of claim 7, wherein the threshold detection circuit is configured to compare a combination of the first-order component and the second-order component to a threshold.

9. The circuit of claim 1, further comprising an adaptive sampler for sampling the digital signal, the adaptive sampler having a clock input, wherein the clock signal supply circuit is further for providing a third clock signal having a third phase to the adaptive sampler clock input.

10. The circuit of claim 9, wherein the third phase comprises a selectively variable offset; wherein the adaptive sampler is configured to sample the digital signal according to the third phase; and wherein samples obtained from the adaptive sampler are used for measuring a data eye of the digital signal while the data sampler and edge sampler continue to sample the digital signal according to the first and second phases, respectively.

11. The circuit of claim 9, further comprising an adaptation circuit for using samples from the adaptive sampler to optimize a feedback equalizer.

12. The circuit of claim 1, further comprising a decision feedback equalization (DFE) circuit comprising a clock input, wherein the clock signal supply circuit is further for providing a fourth clock signal having a fourth phase to the DFE circuit clock input.

13. The circuit of claim 12, wherein the fourth phase comprises a selectively variable offset; and wherein the DFE circuit is configured to produce an equalized signal according to an optimized timing based on the fourth phase.

14. A method of receiving a digital signal comprising:
providing a first clock signal having a first phase to a data sampler and obtaining a first plurality of samples from the data sampler;
providing a second clock signal having a second phase to an edge sampler, wherein the first phase and the second phase are offset with respect to each other, and obtaining a second plurality of samples from the edge sampler;
using the first clock signal and second clock signal:
temporarily storing in temporary storage the first plurality of samples from the data sampler and the second plurality of samples from the edge sampler; and
in accordance with the temporarily stored first plurality of samples from the data sampler, received from the temporary storage under control of the first clock signal, and the second plurality of samples from the edge sampler, received from the temporary storage under control of the second clock signal, providing a sequence of phase correction values; and
adjusting the first phase of the first clock signal and second phase of the second clock signal based on the sequence of phase correction values.

15. The method of claim 14, wherein providing the sequence of phase correction values based on the phase of the second clock signal includes generating a sequence of values that indicate, at a sequence of times, whether the first clock signal is early, late or synchronized with data value transitions in the digital signal, wherein the sequence of values includes, over time, a first value corresponding to the first clock being early relative to data transitions in the data signal, a second value corresponding to the first clock being late relative to data transitions in the data signal, and a third value corresponding to the first clock being synchronized with data transitions in the data signal.

16. The method of claim 15, wherein providing the sequence of phase correction values based on the phase of the second clock signal further includes integrating the sequence of values to produce an integrated value and scaling the integrated value to produce a sequence of combined values, and providing the sequence of phase correction values based on the sequence of combined values.

17. The method of claim 15, wherein generating the sequence of values indicating, at a sequence of times, whether the first clock signal is early, late or synchronized with data value transitions in the digital signal includes comparing, with a logic circuit, data samples obtained from the data sampler using the first clock signal and edge samples obtained from the edge sample using the second clock signal to produce the sequence of values.

18. The method of claim 17, wherein generating the sequence of values includes generating a value, comprising an early/late value, in the sequence of values by:
   determining whether a transition between first and second samples of the first plurality of samples is detected,
   comparing a timing between corresponding first samples of the first and second pluralities of samples; and
   providing the early/late value based on a result of said determining whether a transition between the first and second samples of the first plurality of samples is detected, and based on a result of the timing comparison between the corresponding first samples of the first and second pluralities of samples.

19. The method of claim 18, wherein generating the value, comprising an early/late value, in the sequence of values, includes:
   using a result of the timing comparison between the corresponding first samples of the first and second pluralities of samples to update an early/late value in the sequence of early/late values if a transition is detected between the first and second samples of the first plurality of samples; and
   ignore a result of the timing comparison between the corresponding first samples of the first and second plurality of samples if a transition is not detected between the first and second samples of the first plurality of samples.

20. A circuit for receiving a digital signal comprising:
   a data sampler and an edge sampler for sampling the digital signal, each sampler having a clock input;
   a clock signal supply circuit for providing a first clock signal having a first phase to the data sampler clock input and a second clock signal having a second phase to the edge sampler clock input, wherein the first and second phases are offset with respect to each other;
   temporary storage for receiving a first plurality of samples of the digital signal sampled by the data sampler and a second plurality of samples of the digital signal sampled by the edge sampler; and
   a digital phase detector, having inputs coupled to outputs of the temporary storage, for:
      generating a sequence of early/late values indicating, at a sequence of times, whether the first clock signal is early, late or synchronized with data value transitions in the digital signal, wherein the sequence of early/late values includes, over time, a first value corresponding to the first clock being early relative to data transitions in the data signal, a second value corresponding to the first clock being late relative to data transitions in the data signal, and a third value corresponding to the first clock being synchronized with data transitions in the data signal;
      integrating the sequence of early/late values and scaling the integrated value to produce a sequence of combined values; and
      providing a sequence of phase correction values;
   wherein the clock signal supply circuit is operative to adjust the first and second phases based on the sequence of phase correction values.

* * * * *